US010393831B2

(12) United States Patent
Murphy-Boesch et al.

(10) Patent No.: US 10,393,831 B2
(45) Date of Patent: Aug. 27, 2019

(54) NEGATIVE RESISTANCE PREAMPLIFIER FOR INDUCTIVELY COUPLED LOCAL MRI COILS

(71) Applicants: Joseph A. Murphy-Boesch, Rockville, MD (US); Stephen Dodd, Rockville, MD (US); Chunqi Qian, Rockville, MD (US); Alan Koretsky, Rockville, MD (US); OFFICE OF TECHNOLOGY TRANSFER, NATIONAL INSTITUTES OF HEALTH, Rockville, MD (US)

(72) Inventors: Joseph A. Murphy-Boesch, Rockville, MD (US); Stephen Dodd, Rockville, MD (US); Chunqi Qian, Rockville, MD (US); Alan Koretsky, Rockville, MD (US)

(73) Assignee: The United States of America, as Represented by the Secretary, Department of Health and Human Services, Bethesda, MD (US)

( * ) Notice: Subject to any disclaimer, the term of this patent is extended or adjusted under 35 U.S.C. 154(b) by 104 days.

(21) Appl. No.: 15/309,336

(22) PCT Filed: May 7, 2015

(86) PCT No.: PCT/US2015/029674
§ 371 (c)(1),
(2) Date: Nov. 7, 2016

(87) PCT Pub. No.: WO2015/171885
PCT Pub. Date: Nov. 12, 2015

(65) Prior Publication Data
US 2017/0067974 A1    Mar. 9, 2017

Related U.S. Application Data

(60) Provisional application No. 61/989,795, filed on May 7, 2014.

(51) Int. Cl.
*G01R 33/36* (2006.01)
*G01R 33/561* (2006.01)

(52) U.S. Cl.
CPC ..... *G01R 33/3621* (2013.01); *G01R 33/3642* (2013.01); *G01R 33/3692* (2013.01); *G01R 33/5616* (2013.01)

(58) Field of Classification Search
CPC ............ G01R 33/3621; G01R 33/5616; G01R 33/3642; G01R 33/3692
(Continued)

(56) References Cited

U.S. PATENT DOCUMENTS 3,681,674 A * 8/1972 Terry, Jr. ............. H02M 3/3381
327/581
5,589,777 A * 12/1996 Davis ..................... G01R 31/02
324/210

(Continued)

*Primary Examiner* — Giovanni Astacio-Oquendo
(74) *Attorney, Agent, or Firm* — Polsinelli PC

(57) ABSTRACT

A novel MRI-compatible amplifier design uses positive feedback from a low-noise Field-Effect Transistor to amplify the signal current within a resonant NMR coil. The amplified signal current in this low-power circuit produces RF flux can be coupled out to receiving loops positioned externally without significant loss in sensitivity. In other aspects, the amplifier may be remotely powered by external resonant loops, a small non-magnetic battery, or optical power, such that the NMR coil can be positioned during highly invasive procedures such as for surgical resection of tumors in deep-lying tissues to develop high-resolution images.

19 Claims, 3 Drawing Sheets

(58) Field of Classification Search
USPC .......................................... 324/300, 318, 322
See application file for complete search history.

(56) References Cited

U.S. PATENT DOCUMENTS

| | | | | |
|---|---|---|---|---|
| 6,369,550 | B1* | 4/2002 | Lou ........................... | G05F 1/70 |
| | | | | 323/208 |
| 2002/0130664 | A1* | 9/2002 | Birken ..................... | G01V 3/15 |
| | | | | 324/329 |
| 2007/0200563 | A1* | 8/2007 | Daalmans .......... | G01N 27/9006 |
| | | | | 324/237 |
| 2011/0147706 | A1* | 6/2011 | Radosavljevic ....... | B82Y 10/00 |
| | | | | 257/18 |
| 2014/0091787 | A1* | 4/2014 | Hyodo ................... | G01V 3/105 |
| | | | | 324/236 |
| 2017/0060150 | A1* | 3/2017 | Stefanski ............... | G05D 23/27 |
| 2018/0036740 | A1* | 2/2018 | Nelson ................... | B02C 19/18 |
| 2018/0059176 | A1* | 3/2018 | Ding .................... | G01R 1/0433 |

* cited by examiner

NEGATIVE RESISTANCE PREAMPLIFIER FOR INDUCTIVELY COUPLED LOCAL MRI COILS

FIELD

The present disclosure generally relates to devices and methods for improving magnetic resonance imaging systems, and in particular to systems and methods for amplifying signals received by coils of magnetic resonance imaging systems.

BACKGROUND

Typically, magnetic resonance imaging (MRI) systems are used for a variety of imaging applications, in addition to medical imaging. Such systems typically include coil arrangements for generating magnetic fields to excite gyromagnetic materials in the object being imaged. The coils are also used to detect signals generated by the gyromagnetic materials as they return to various states of equilibrium.

Often the signals acquired by the surface coil arrangements of MRI systems are amplified before subsequent signal processing at a computing device. The amplifiers and/or preamplifiers used in the systems are connected to the coil arrangements through electrical wires. These wired connections, however, increase the size of the coil arrangements and limit the deployment of the coils when imaging internal structures.

SUMMARY

Various embodiments of an amplifier, disclosed herein, allows for wireless imaging by imbedding the device in an imaging coil and implanting the device in a human body and having a second device to provide power and intercept the signal. This application could be scaled for use in animal imaging. This device could also serve as an improvement to the current low-impedance preamplifier system and replace the now marketed device for NMR phased array elements as well as be added to tuned NMR receiver coils to deliver specific gains at specific NMR frequencies.

In one embodiment, an amplifier for a resonant coil of a magnetic resonance imaging system includes a low-noise field-effect transistor to generate a positive feedback, wherein the positive feedback is received in the resonant coil.

In another embodiment, an amplifier assembly for a magnetic resonance imaging system includes a radio frequency coil, a variable capacitor in parallel connection to the radio-frequency coil, and a diode in parallel electrical connection to the radio frequency coil and the variable capacitor. The amplifier assembly also includes a field-effect transistor in electrical connection with the radio-frequency coil, the capacitor, and the diode. A source terminal of the transistor is in electrical connection with a cathode of the diode and a gate terminal of the transistor is in electrical connection with an anode of the diode.

Additional objectives, advantages, and novel features will be set forth in the description which follows or will become apparent to those skilled in the art upon examination of the drawings and detailed description which follows.

BRIEF DESCRIPTION OF THE DRAWINGS

Corresponding reference characters indicate corresponding elements among the view of the drawings. The headings used in the figures do not limit the scope of the claims.

DETAILED DESCRIPTION

The present disclosure generally relates to an amplifier for signal detection systems, such as magnetic resonance imaging (MRI) systems and other nuclear magnetic resonance (NMR) systems. In particular, the disclosure relates to a novel design for an MRI-compatible preamplifier that uses positive feedback from a low-noise Field-Effect Transistor (FET) to amplify the signal current within a resonant MRI coil or a sample coil. In one aspect, the amplified signal current in the low-power preamplifier circuit produces radio-frequency (RF) flux that can be received at pick-up coils of the MRI system that are positioned remotely or externally away from the object being imaged without significant loss in sensitivity.

In another aspect, when similarly powered by external resonant loops or by a light source, the resonant sample coil can be flexibly positioned near internal tissues and used to develop high-resolution images of highly invasive situations, such as for surgical resection of tumors in deep-lying tissues. In this aspect, the high sensitivity of an internally deployed resonant MRI coil is maintained by the preamplifier circuit design that uses transistor feedback to create a "negative resistance" and thus positive feedback to provide current gain in the resonant coil. The weak current induced in the resonant coil is amplified through mixing interactions between the amplifier of the present disclosure and with an externally generated pumping signal. Such an integrated amplification scheme could find important applications in implanted or catheter detectors.

Figure 1:
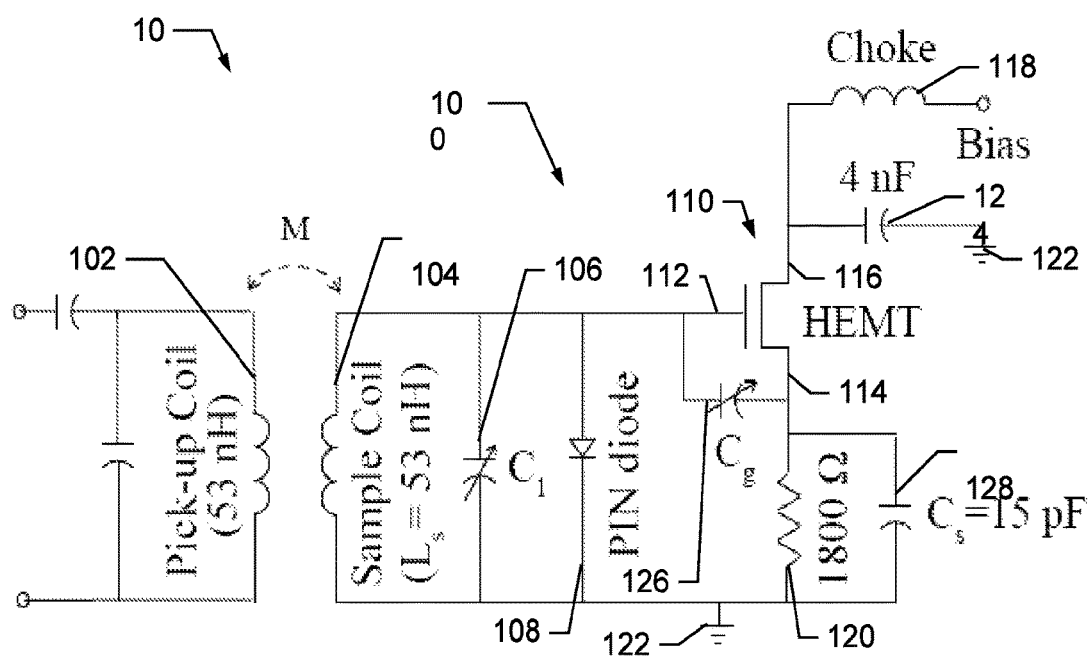
FIG. 1 is a circuit diagram of a current amplifier for a remotely coupled magnetic resonance detector according to one embodiment.

As shown in FIG. 1, one embodiment of an amplified coil device 10 that includes a current amplifier assembly 100 remotely coupled to a MRI pick-up coil 102. The current amplifier assembly 100 is electrically connected to an RF coil 104. By way of example, the RF coil 104 may be a sample coil to detect signals generated in a sample. In one embodiment, the RF coil 104 is an approximately 2.2 cm diameter loop. In various embodiments, the diameter of the RF coil 104 is small enough to be used as internal coils disposed within a body. Therefore the RF coil 104 may have a diameter in a range between approximately 5-50 mm in diameter. While suited for internal positioning, the RF coils 104 are also preferably are large enough to couple inductively to external pick-up coils, such as pick up coil 102. The pick-up coil 102 can be of the same size, but typically they are much larger in order to increase Q and thereby increase inductive coupling to the RF coil 104.

In one aspect, the RF coil 104 may have an inductance in a range between approximately 8 nH to 100 nH. In the embodiment shown, the RF coil 104 has an inductance of approximately 53 nH. The current amplifier assembly 100 also includes a capacitor 106 in parallel relation to the RF coil 104. When deployed, the capacitor 106 is variable and empirically adjusted for maximum response at the Larmor frequency of the object or sample being tested or imaged. For example, as explained more fully below, the capacitor 106 may be adjusted for maximum response to the Larmor frequency of the isotope sodium-23 (Na-23).

In the embodiment shown, the RF coil 104 and parallel capacitor 106 and further connected in parallel with a diode 108. The diode 108 may be a PIN diode, as understood by one having ordinary skill in the art. In one aspect, the diode 108 includes a doped intrinsic semiconductor region between a p-type semiconductor portion and an n-type semiconductor portion. By way of example and not limitation, the lifetime of charge in the intrinsic region of the diode is typically between 0.5 and 5 microseconds, such that there is adequate charge available to pass current from the NMR coil during the transmit conditions of NMR spectroscopy and MRI imaging sequences. The voltages at the gate terminal are thereby maintained at a low level. In another embodiment, the RF coil 104 may be a pair of crossed diodes.

The current amplifier assembly 100 also includes a High-electron-mobility transistor (HEMT) or a heterostructure field-effect transistor (FET) 110. By way of example and not limitation the FET transistor 110 may be a transistor produced by Avago Technologies of San Jose, Calif., having part number ATF-34143.

In various aspects, the transistor 110 is deployed in the current amplifier assembly 100 in an ordinary common-source configuration where a gate terminal 112 is electrically connected to an anode of the diode 108, while the source terminal 114 is electrically connected to a cathode of the diode 108. In this configuration, the voltage gain is determined by the transconductance ($g_m$) multiplied by the effective drain impedance. As such, negative resistance can be intentionally introduced to reduce the input impedance. In a negative resistance amplifier, however, a large gain is obtainable using a very low bias current, as long as the circuit resistance can be effectively reduced by the negative resistance created by the transistor feedback.

To generate the desired gain in the RF coil 104 of the current amplifier assembly 100, additional components and inputs are further connected to the transistor 110. As shown in FIG. 1, a bias voltage is applied at a drain terminal 116 of the transistor 110 through an inductor choke coil 118 to provide a bias current assembly. In one aspect, the bias current is limited to approximately 0.5 mA by an 1800Ω source resistor 120 in series with the source terminal 114. As a result, the transconductance ($g_m$) in the transistor 110 is reduced to approximately 0.005 Siemens. This is approximately twenty times smaller than its typical value when exposed to an approximate 30 mA bias current.

In another aspect, when operating at typical magnetic resonance radio frequencies, the drain terminal 116 of the transistor 110 is shorted to a ground 122. In one embodiment, the drain terminal 116 is shorted to ground through an approximate 4 nF capacitor 124.

To cancel the positive impedance occurring within in the current amplifier assembly 100, a variable feedback capacitor ($C_g$) 126 is used to transform the source capacitor ($C_s$) 128 such that it produces a negative resistance at the gate terminal 112 of the transistor 110. As a result, the effective parallel negative resistance is approximately equal to: $-(g_m/\omega^2 C_s C_g) - (C_s + C_g)^2 / C_s C_g g_m$. This value can be derived from the hybrid-π model of transistor, as disclosed in *Planar Microwave Engineering* by T. Lee; Cambridge University Press; 2004 at pages 420-427, which is incorporated herein by reference.

In one embodiment, the source capacitor 128 has a capacitance of approximately 15 pF and the feedback capacitor 126 has a capacitance of approximately, 1 pF. Thus, the feedback capacitor 126 could transform the source capacitor 128 to effectively act as an approximate −3000Ω parallel resistor, with approximately 1.5 times the effective parallel resistance of the RF coil 104 having a Q factor of 45. In various embodiments, the parallel negative resistance is configured to be closer to the parallel positive resistance to achieve higher gain. Therefore, the feedback capacitor 126 may be empirically adjusted to "sharpen" the frequency response curve.

As a result, a remotely coupled detector, wherein there is inductive coupling between the external pick-up coil 102 and the current amplifier assembly 100 with an integrated negative resistance amplifier can achieve high gain with comparable sensitivity as a conventional amplifier connected directly to the resonant sample coil 104 and 106. Moreover, when compared to direct wired connections, wherein there is cable loss between the sample coil and the input of the conventional amplifier (i.e. a directly connected coil), the current amplifier assembly 100 is equally as sensitive with adequate gain.

Figure 2:
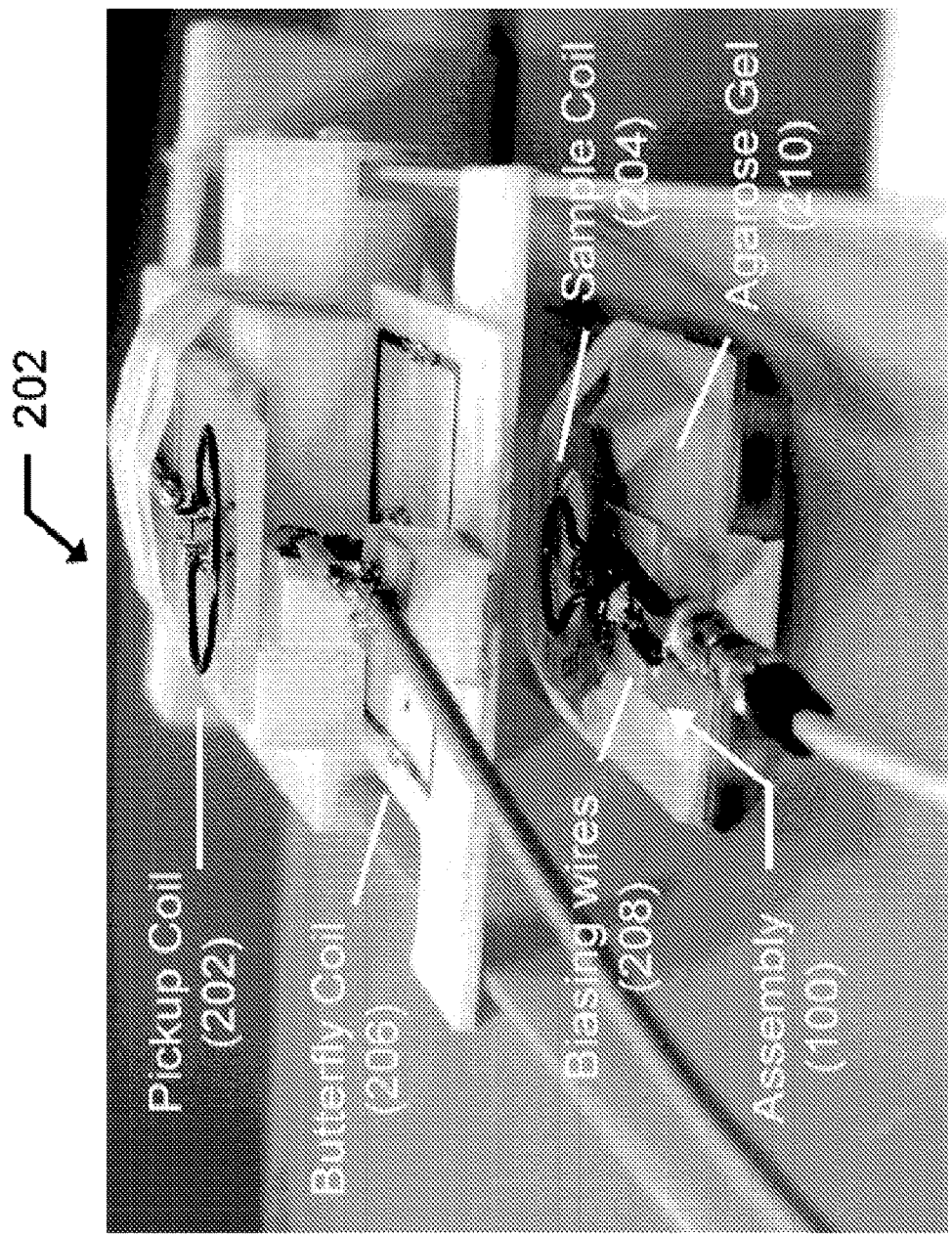
FIG. 2 is a photograph of a testing apparatus for testing a current amplifier for remotely coupled magnetic resonance detectors according to one embodiment.

Referring now to FIG. 2, a testing assembly 200 to test the circuit sensitivity is depicted. As shown, the assembly 200 includes a pick-up coil 202 separated from a RF sample coil 204, that is substantially similar to the RF coil 104. In one aspect, the pick-up coil 202 is separated from the RF coil 204 by a distance of approximately 4.5 cm to receive amplified signals. A butterfly coil 206 is used to generate a transmit field with minimum perturbations to the receiving coils (not shown). Biasing wires 208 are shown engaged to the common and the drain terminals of the current amplifier assembly 100. The entire testing assembly 200 is placed inside an 11.7 T superconducting magnet system (not shown) such as, those manufactured by Magnex Scientific located in Oxford, United Kingdom, for example. Using the magnet system, the testing assembly 200 detects a signal from isotope Na-23 at 132.14 MHz in conjunction with a nuclear magnetic resonance (NMR) platform, such as the Avance III system by the Bruker Corporation of Billerica, Mass., for example.

Figure 3:
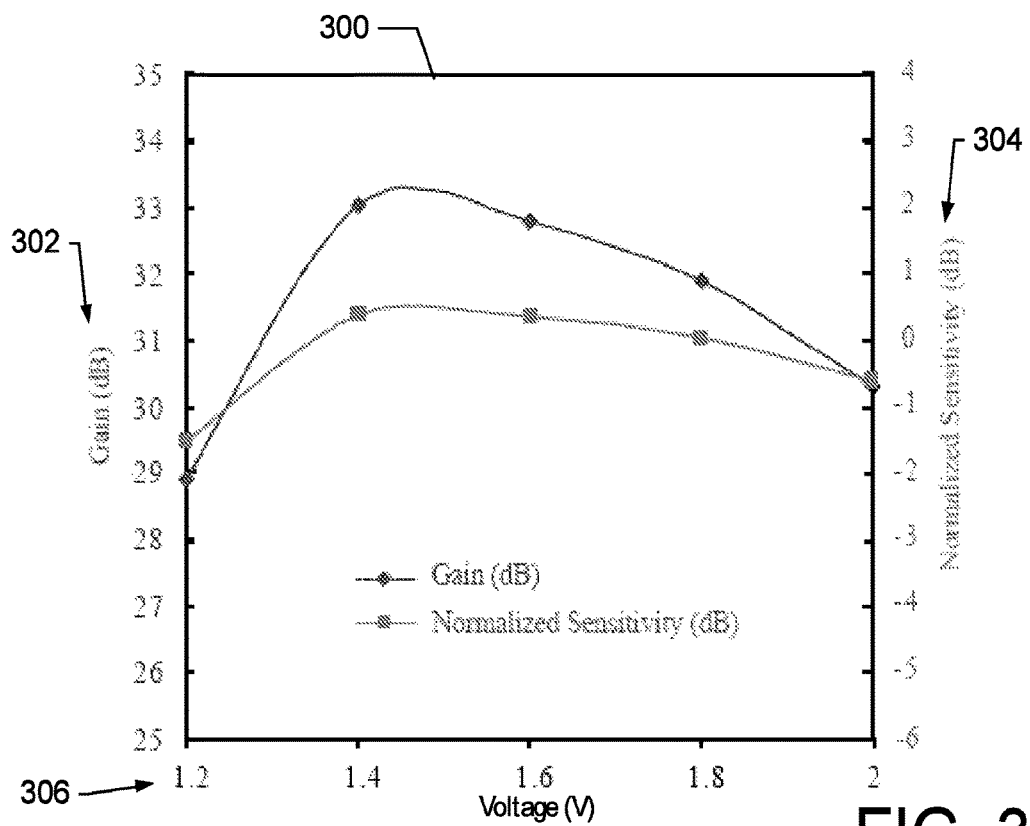
FIG. 3 is a graph illustrating the gain and sensitivity of the current amplifier plotted against the biasing voltage.

FIG. 3 is a graph 300 illustrating the amplifier gain 302 and the normalized sensitivity 304 of the current amplifier assembly 100 plotted against biasing voltages 306 between 1.2 and 2 volts. To analyze the performance of the current amplifier assembly 100, a single pulse spectrum was first acquired with no bias voltage. Subsequently, the same experiment was performed with various bias voltages 306. For each bias voltage 306, the gain 302 was determined by the intensity ratio of a single pulse spectra acquired with and without bias voltage. The sensitivity data 304 was normalized against a surface coil with wired connections and expressed in units of decibels (dB).

As indicated in FIG. 3, the gain 302 obtained a maximum value of 33 dB for a bias voltage 306 of 1.4 volts. This was followed by a slow decrease in value as the bias 306 is further increased. When compared to a directly-connected surface coil, having the same dimensions as the RF coil 202, the RF coil has almost identical sensitivity for bias voltages between 1.4 V and 1.8 V, when remotely coupled to the current amplifier assembly 100. In one aspect, the similarities in sensitivity are due, at least in part, to the fact the intensity gain was much larger than attenuation when the amplified signals couple to the pick-up coil at a distance.

Figure 4:
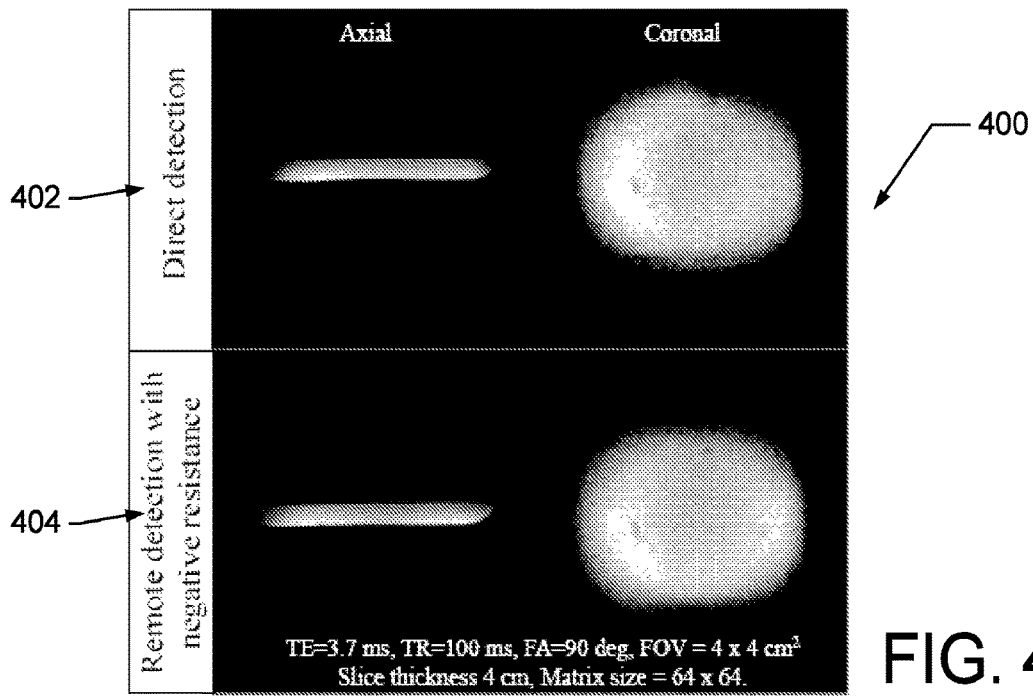
FIG. 4 is a gradient-recalled echo image comparing the quality and sensitivity between images acquired using a standard magnetic resonance detector coil and one coupled to a current amplifier according to one embodiment.

FIG. 4 is a series 400 of gradient-recalled echo (GRE) images acquired using a 2.5M NaCl agarose gel phantom 210, as shown in FIG. 2. The images were acquired along both the x and y directions of a 4 cm thick planar slice by a directly-connected coil tuned for measuring signals from isotope Na-23 and by a remotely coupled negative resistance amplifier assembly 100 containing a coil, similar to the RF coil 104, also tuned for measuring signals from isotope Na-23. As shown, the top panels 402 of FIG. 4 are GRE images acquired by the directly connected coil as a control or benchmark, while the bottom panels 404 are the images captured by the current amplifier assembly 100. It is noted that the images obtained by the negative resistance amplifier had similar quality and comparable sensitivity as the directly connected coil.

In other embodiments, the current amplifier assembly 100 may be a negative resistance amplifier the yields very large gain under very low bias current. While one embodiment of the testing assembly 200 is shown with wires to provide the direct current (DC) bias, such as from standard bench power supplies or from a non-magnetic battery that may be located near to the current amplifier assembly 100. Other embodiments may use an inductive power configuration or an optical power harvesting configuration to bias the transistor 110 wirelessly. In these embodiments, the low bias current and minimal circuit elements permit adequate enable wireless performance in a small package.

In another embodiment, the protective PIN diode 108 is replaced with a pair of crossed-diodes, configured with anode of the first diode connected to the cathode of the second diode and the anode of the second diode connected to the cathode of the first diode.

Various embodiments of the current amplifier assembly 100 may be used in a variety of applications. For example, one embodiment of the current amplifier assembly 100 may be adapted for use with existing MRI systems where the RF coil 104 will be implanted or otherwise situated deep within an object or a body through an orifice or a surgical opening. In this example, a tuned local RF coil, such as the RF coil 104, couples efficiently with a tuned external pick-up coil, such as the pick-up coil 102. With this embodiment, the need for a direct signal connection is substantially reduced or eliminated, thus simplifying a medical procedure to obtain high-quality diagnostic images of a deep-lying tissue. When in use a device containing the amplifier assembly is attached to a suitable size imaging coil and both would be embedded within a biocompatible module. The module would be implanted or otherwise situated near the region to be imaged, and an imaging accessory would be provided to power and sense signals from it.

In another embodiment, an imaging coil and accompanying the current amplifier assembly 100 could be scaled down for use in animals or other living organism. In one aspect, the device and the current amplifier assembly 100 may be implanted in an organism for continuous imaging.

In yet another embodiment, the current amplifier assembly 100 could be inserted into one or more secondary resonant circuits of a nuclear magnetic resonance (NMR) phased array element, effectively supplanting the low-impedance preamplifier that is used today.

In various other embodiments, the current amplifier assembly 100 can be manufactured and provided in kit form as one or more integrated modules that are designed to be incorporated or engaged to existing tuned NMR receiver coils and tailored to deliver specific gains at specific NMR frequencies. In these embodiments, the kits could serve as an inexpensive and mass-produced alternative to standard NMR preamplifiers.

Additional embodiments of amplifier assembly 100 may be further reduced in size, have a more stabilized circuit layout, and may require less power, such that t assembly may be powered an optical source or an RF source. In one aspect, the power necessary to operate the amplifier assembly 100 is on the order of microwatts and milliwatts, so tissue heating from amplifier assembly 100 is of minimal concern.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. An amplifier for a resonant coil of a magnetic resonance imaging system, the amplifier comprising:
    a field-effect transistor to generate a positive feedback, wherein the positive feedback is received in the resonant coil; and,
    wherein the amplifier is directly engaged to an imaging coil of the magnetic resonance imaging system.

2. The amplifier of claim 1, wherein the field-effect transistor generates a radio-frequency flux in the resonant coil that amplifies a signal generated within one of a plurality of pick-up coils.

3. The amplifier of claim 2, wherein the resonant coil comprises one of a plurality of pick-up coils for the magnetic resonance imaging system and wherein a radio-frequency flux generated by the field-effect transistor is generated by two or more of the plurality of pick-up coils.

4. The amplifier of claim 1, wherein the amplifier and the imaging coil are disposed to image of an internal portion of a subject.

5. The amplifier of claim 4, wherein the amplifier and the imaging coil are powered by one or more power devices disposed external to the subject and one or more signals generated by the amplifier and the imaging coil are received by one or more receiving devices disposed external to the subject.

6. The amplifier of claim 1, wherein the amplifier has a low-impedance.

7. The amplifier of claim 1, wherein the field-effect transistor comprises a high-electron-mobility transistor (HEMT).

8. An amplifier assembly for a magnetic resonance imaging system, the amplifier assembly comprising:
    a radio frequency coil;
    a variable capacitor in parallel connection to the radio-frequency coil;
    a diode in parallel electrical connection to the radio frequency coil and the variable capacitor;
    a field-effect transistor in electrical connection with the radio-frequency coil, the capacitor, and the diode; and
    wherein a source terminal of the field-effect transistor is in electrical connection with a cathode of the diode and a gate terminal of the transistor is in electrical connection with an anode of the diode.

9. The amplifier assembly of claim 8, wherein a drain terminal of the field-effect transistor receives a bias voltage from an external power source.

10. The amplifier assembly of claim 9, wherein the drain terminal of the field-effect transistor further comprises an inductor choke in electrical connection with the external power source, such that the inductor choke generates a bias current within the field-effect transistor.

11. The amplifier assembly of claim 9, wherein the bias current within the field-effect transistor is limited by a source resistor electrically connected in series between the source terminal and the cathode of the diode.

12. The amplifier assembly of claim 10, wherein the source resistor has a resistance equal to approximately 1800 Ohm and the bias current is in a range between approximately 0.5 mA and approximately 30 mA.

13. The amplifier assembly of claim 10, wherein the drain terminal of the field-effect transistor is shorted to ground via the capacitor electrically connected in parallel to the inductor choke.

14. The amplifier assembly of claim 8, wherein the source terminal is electrically connected to a source resistor connected in series between the source terminal and the cathode of the diode and a source capacitor electrically connected in parallel to the source resistor.

15. The amplifier assembly of claim 14, wherein the source capacitor has a capacitance in a range between approximately 5 pF and 25 pF.

16. The amplifier assembly of claim 8, wherein the gate terminal is electrically connected to a gate capacitor connected in parallel between the gate terminal and the cathode of the diode.

17. The amplifier assembly of claim 16, wherein the gate capacitor is a variable capacitor and has a capacitance in a range between approximately 0.1 pF and 5 pF.

18. The amplifier assembly of claim 8, further comprising:
- a source resistor connected in series between the source terminal and the cathode of the diode and a source capacitor electrically connected in parallel to the source resistor;
- a gate capacitor connected in parallel between the gate terminal and the cathode of the diode; and
- wherein the amplifier assembly has an effective parallel negative resistance approximately equal to an additive inverse of a first capacitance of the source capacitor divided by a product of a second capacitance of the gate capacitor and the transconductance of the field-effect transistor.

19. The amplifier assembly of claim 18, wherein the effective parallel negative resistance is approximately equal to a parallel positive resistance of the circuit.

* * * * *